(12) United States Patent
Shiba et al.

(10) Patent No.: US 7,670,757 B2
(45) Date of Patent: Mar. 2, 2010

(54) PHOTOSENSITIVE RESIN COMPOSITION, METHOD OF FORMING LEVEL DIFFERENCE PATTERN USING THE PHOTOSENSITIVE RESIN COMPOSITION, AND METHOD OF PRODUCING INK JET HEAD

(75) Inventors: Shoji Shiba, Sagamihara (JP); Hiroe Ishikura, Kawasaki (JP); Akihiko Okano, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 10/577,218

(22) PCT Filed: Jun. 24, 2005

(86) PCT No.: PCT/JP2005/012161

§ 371 (c)(1), (2), (4) Date: Apr. 26, 2006

(87) PCT Pub. No.: WO2006/001516

PCT Pub. Date: Jan. 5, 2006

(65) Prior Publication Data

US 2007/0031756 A1    Feb. 8, 2007

(30) Foreign Application Priority Data

Jun. 28, 2004    (JP) .............................. 2004-190479

(51) Int. Cl.
*G03F 7/40* (2006.01)
*B41J 1/135* (2006.01)

(52) U.S. Cl. ...................... 430/320; 430/324; 430/326; 347/20; 347/44

(58) Field of Classification Search .............. 430/270.1, 430/272.1, 273.1, 281.1, 320, 324, 326, 329, 430/330, 32, 394; 347/20, 44, 45, 46, 47
See application file for complete search history.

(56) References Cited

U.S. PATENT DOCUMENTS

| | | | |
|---|---|---|---|
| 4,565,859 A | 1/1986 | Murai et al. | 528/365 |
| 4,841,017 A | 6/1989 | Murai et al. | 525/327.3 |
| 6,158,843 A | 12/2000 | Murthy et al. | 347/47 |
| 6,379,571 B1 | 4/2002 | Kobayashi et al. | 216/27 |
| 6,455,112 B1* | 9/2002 | Ohkuma et al. | 427/504 |
| 2003/0011655 A1* | 1/2003 | Miyagawa et al. | 347/20 |
| 2003/0059709 A1* | 3/2003 | Wheeler et al. | 430/270.1 |
| 2004/0070643 A1* | 4/2004 | Kubota et al. | 347/20 |
| 2004/0072107 A1 | 4/2004 | Kubota et al. | 430/320 |
| 2004/0081914 A1* | 4/2004 | Imai et al. | 430/281.1 |
| 2004/0131957 A1 | 7/2004 | Kubota et al. | 430/15 |
| 2006/0117564 A1 | 6/2006 | Ishikura et al. | 29/890.1 |
| 2007/0081048 A1 | 4/2007 | Ishikura et al. | 347/65 |

FOREIGN PATENT DOCUMENTS

EP    0819986    1/1998

(Continued)

*Primary Examiner*—Cynthia H Kelly
*Assistant Examiner*—Anca Eoff
(74) *Attorney, Agent, or Firm*—Fitzpatrick, Cella, Harper & Scinto

(57) ABSTRACT

To provide a positive type photosensitive resin composition, containing at least an acrylic resin having a carboxylic anhydride structure in a molecule, and a compound that generates an acid when irradiated with light.

5 Claims, 9 Drawing Sheets

FOREIGN PATENT DOCUMENTS

| | | |
|---|---|---|
| EP | 1251399 | 10/2002 |
| EP | 1380423 | 1/2004 |
| EP | 1380425 | 1/2004 |
| JP | 60-161973 | 8/1985 |
| JP | 63-221121 | 9/1988 |
| JP | 01-009216 | 1/1989 |
| JP | 02-140219 | 5/1990 |
| JP | 06-045242 | 2/1994 |
| JP | 10-291317 | 11/1998 |
| JP | 2001-010070 | 1/2001 |

* cited by examiner

PHOTOSENSITIVE RESIN COMPOSITION, METHOD OF FORMING LEVEL DIFFERENCE PATTERN USING THE PHOTOSENSITIVE RESIN COMPOSITION, AND METHOD OF PRODUCING INK JET HEAD

TECHNICAL FIELD

The present invention relates to a photosensitive resin composition that can be suitably used in producing an ink jet head for generating a recording liquid droplet for use in an ink jet recording method. The present invention also relates to: a method of forming a level difference pattern and a method of producing an ink jet head each using the photosensitive resin composition; and an ink jet head produced by the method of producing an ink jet head.

BACKGROUND ART

An ink jet head applicable to an ink jet recording method (liquid discharge recording method) involving discharging a recording solution such as ink to carry out recording is generally equipped with: an ink flow path; a liquid discharge energy generating portion placed in part of the ink flow path; and a fine ink discharge port (called an "orifice") for discharging ink in the ink flow path by means of energy from the liquid discharge energy generating portion. Examples of a method of producing such an ink jet head conventionally include:

(1) a production method involving: perforating an element substrate on which heaters for generating thermal energy for discharging a liquid, a driver circuit for driving those heaters, and the like are formed with through holes for ink supply; forming a pattern serving as an ink flow path wall by means of a negative type resist; and bonding a plate on which an ink discharge port is formed by means of electroforming or excimer laser processing to the pattern; and (2) a method involving: preparing an element substrate formed in the same manner as in the above production method; processing a resin film (in general, polyimide is suitably used) to which an adhesive layer is applied with excimer laser to form an ink flow path and an ink discharge port; and attaching the processed ink flow path structure plate and the element substrate to each other under heat and pressure.

In the ink jet head produced according to each of the production methods, in order to enable fine ink droplets for high-image-quality recording to be discharged, a distance between a heater affecting a discharge amount and a discharge port must be as short as possible. To achieve this, the height of the ink flow path must be reduced, or the size of: a discharge chamber, which becomes part of the ink flow path, as a bubble generating chamber in contact with the liquid discharge energy generating portion; or the discharge port must be reduced. That is, the ink flow path structure to be laminated on the substrate must be made thin in order to enable the head produced according to each of the above methods to discharge a fine ink droplet. However, it is extremely difficult to process a thin ink flow path structure plate with high accuracy before the plate is attached to a substrate.

To solve the problems in those production methods, JP-B 06-45242 discloses a method of producing an ink jet head (also referred to as a casting method) involving: patterning a mold of an ink flow path by means of a photosensitive material on a substrate on which a liquid discharge energy generating element is formed; applying and forming a coating resin layer on the substrate to cover the mold pattern; forming, in the coating resin layer, an ink discharge port in communication with the mold of an ink flow path; and removing the photosensitive material used for the mold. In the method of producing a head, a positive type resist is used as the photosensitive material because the resist can be easily removed. According to the production method, an ink flow path, a discharge port, and the like can be formed extremely finely with extremely high accuracy because photolithography for a semiconductor is applied.

However, after the ink flow path pattern has been formed by means of the positive type resist, the positive type resist is coated with a negative type resist to form a discharge port. Therefore, when light corresponding to the absorption wavelength region of the negative type resist is applied, the pattern formed by means of the positive type resist is irradiated with the light having the wavelength region. As a result, a decomposition reaction or the like of the positive type resist material is promoted, with the result that inconvenience may occur. Furthermore, the negative type resist is applied onto the ink flow path pattern formed by means of the positive type resist, so there may arise problems such as the dissolution and deformation of the ink flow path pattern upon application of the negative type resist.

JP-A 2004-42650 and JP-A 2004-46217 each disclose a photo-degradable resin having a carboxylic anhydride structure as a positive type resist material capable of avoiding the above problems.

Meanwhile, a structure has been investigated for making an ink jet head thinner and for increasing the performance of the head, in which a discharge port is arranged above a discharge pressure generating element placed on a substrate, and the shape of an ink flow path in communication with the discharge port is changed in the height direction of the substrate. With regard to a change in shape of an ink flow path in the height direction of a substrate, JP-A 10-291317 discloses that, in excimer laser processing of an ink flow path structure, the opacity of a laser mask is partially changed to control the processing depth of a resin film, so a change in shape of an ink flow path in three-dimensional directions, that is, in-plane directions parallel with an element substrate and the height direction of the element substrate is realized.

JP-A 2004-46217 cited above also discloses a method involving: creating a mold constituting a part serving as an ink flow path by means of a positive type resist in a two-layer structure; patterning each of the upper layer and the lower layer into a desired shape to change the shape of an ink flow path in the height direction of a substrate.

In the method of producing an ink jet head using the casting method described above, investigation has been made to solve each of the following problems in additionally increasing production efficiency.

(1) Problem with regard to the sensitivity and photosensitive wavelength of a positive type photosensitive resin composition In an acrylic resin having an acid anhydride structure in a positive type photosensitive resin composition disclosed in each of JP-A 2004-42650 and JP-A 2004-46217 cited above, a decomposition reaction progresses by virtue of energy absorbed by a carbonyl group, so light having a relatively short wavelength region must be used and the selectivity of the wavelength of light to be applied is narrow. For this reason, when a mold constituting a part serving as an ink flow path has a two-layer structure, a positive type photosensitive resin composition to be combined with the mold can be selected from only a narrow range, so the degree of freedom of design for increasing production efficiency and reducing a production cost is low.

In addition, in additionally increasing efficiency in a production process for a mold constituting a part serving as an ink flow path, a composition with increased sensitivity has been required.

(2) RE: process efficiency in forming an ink flow path the shape of which changes in a height direction from a substrate to a discharge port In a method involving the use of laser processing described above, control in a depth direction in the laser processing can be conducted in principle. However, excimer laser used for such processing, which is different from excimer laser used for exposure of a semiconductor, is laser having high brightness in a wide bandwidth. Therefore, it is very difficult to stabilize laser illuminance while suppressing a fluctuation in illuminance in a plane to be irradiated with laser. In particular, in a high-image-quality ink jet head, unevenness in discharge property due to a fluctuation in processed shape between discharge nozzles is observed as image unevenness, so the realization of an increase in processing accuracy is of great concern. Furthermore, in many cases, a minute pattern cannot be formed owing to a taper attached to a plane to be processed with laser/

On the other hand, when a mold constituting a part serving as an ink flow path is made of a positive type resist and has a two-layer structure, in order to selectively pattern each of the upper layer and the lower layer, the photosensitive wavelength of the upper layer and the photosensitive wavelength of the lower layer are separated from each other in such a manner that an exposing condition of the one layer does not affect that of the other layer. In addition, 2 exposing devices having different irradiation wavelengths must be used for selectively separating exposure wavelengths as described above. Only one exposing device can separate an irradiation wavelength by means of an optical filter, in which case an expensive optical filter is needed. Furthermore, the absorption wavelength ends of the respective material partly overlap. Therefore, in order to prevent the lower layer resist from reacting when exposing the upper layer resist to light, the upper layer resist must be exposed to light after light having a wavelength region in which the upper layer resist originally reacts is partly cut. In such a case, a reduction in sensitivity often occurs.

Even in the case where the wavelength region of light to be applied to the upper layer is the same as that of light to be applied to the lower layer, or the wavelength regions partly overlap, the upper layer and the lower layer are allowed to be selectively patterned, that is, an exposing condition for the patterning of the upper layer is prevented from affecting the lower layer, so a problem in a device structure occurring when the exposure wavelengths are selectively separated can be solved, and an additional increase in efficiency of a production process can be achieved.

Furthermore, when a mold constituting a part serving as an ink flow path has a two-layer structure, an applying step must be performed at least twice and a prebaking step must be performed at least twice, resulting in an increase in number of steps. If a process having a reduced number of steps can be selected, production efficiency can be increased by selecting the process having a reduced number of steps depending on process design.

DISCLOSURE OF THE INVENTION

The present invention has been made for solving each of the problems described above, and an object of the present invention is to expand a range of selection of photosensitive wavelength while increasing the exposure sensitivity of a positive type photosensitive resin composition using an acrylic resin having a carboxylic anhydride structure. Another object of the present invention is to provide: a method of forming a pattern with which an ink flow path the shape of which changes in a height direction from a substrate to a discharge port can be formed with high accuracy and high efficiency by means of a positive type photosensitive resin composition; and a method of producing an ink jet head using the same.

The present invention includes each of the following inventions.

According to one aspect of the present invention, there is provided a positive type photosensitive resin composition, containing at least: (1) an acrylic resin having a carboxylic anhydride structure in a molecule; and (2) a compound that generates an acid when irradiated with light.

According to another aspect of the present invention, there is provided a method of forming a pattern having a level difference on a substrate by means of a positive type photosensitive resin, including: (1) a step of forming a layer of the above photosensitive resin composition on the substrate; (2) a first photolithographic step of removing a part except a part serving as a first pattern of the layer of the photosensitive resin composition up to a predetermined depth in a thickness direction to form the first pattern composed of a part protruding from the predetermined depth; and (3) a second photolithographic step of removing a part on the substrate except a part serving as a second pattern of the layer of the photosensitive resin composition on which the first pattern is formed while maintaining the shape of the first pattern to prepare a pattern having a level difference shape in which the first pattern is placed on the second pattern, characterized in that: the first lithography step includes process steps of exposure, heating after exposure, and development; a reaction for making the layer of the photosensitive resin composition positive in the first photolithographic step is derived from at least a hydrolytic reaction of a carboxylic anhydride in the acrylic resin; the second photolithographic step includes process steps of exposure and development; and a reaction for making the layer of the photosensitive resin composition positive in the second photolithographic step is derived from at least a main chain decomposition reaction of the acrylic resin.

According to another aspect of the present invention, there is provided a method of producing an ink jet head including: a discharge port for discharging ink; an ink flow path which is in communication with the discharge port and has therein a pressure generating element for discharging the ink; a substrate on which the pressure generating element is formed; and an ink flow path forming member which is joined to the substrate to form the ink flow path, the method including the steps of: (1) arranging a layer of a positive type photosensitive resin composition on the substrate on which the pressure generating element is formed; (2) irradiating a predetermined site of the layer of the photosensitive resin composition with ionization radiation; (3) removing the site irradiated with the ionization radiation through development to form a desired ink flow path pattern; (4) forming, on the ink flow path pattern, a coating resin layer for forming an ink flow path wall; (5) forming, in the coating resin layer placed on the pressure generating element formed on the substrate, an ink discharge port; and (6) dissolving and removing the ink flow path pattern, characterized in that the positive type photosensitive resin composition is the above photosensitive resin composition.

According to another aspect of the present invention, there is provided a method of producing an ink jet head including: a discharge port for discharging ink; an ink flow path which is in communication with the discharge port and has therein a pressure generating element for discharging the ink; a substrate on which the pressure generating element is formed; and an ink flow path forming member which is joined to the substrate to form the ink flow path, the method including the steps of: (1) arranging a layer of a first positive type photosensitive resin on the substrate on which the pressure generating element is formed; (2) forming a layer of a second positive type photosensitive resin on the layer of the first positive type photosensitive resin; (3) irradiating a predetermined site of the layer of the second positive type photosensitive resin with ionization radiation having a wavelength region in which the layer of the second positive type photosensitive resin can react; (4) removing the site of the layer of the second positive type photosensitive resin irradiated with the ionization radiation through development to form a second ink flow path pattern; (5) irradiating a predetermined site of the layer of the first positive type photosensitive resin with ionization radiation having a wavelength region in which the layer of the first positive type photosensitive resin can react; (6) removing the site of the layer of the first positive type photosensitive resin irradiated with the ionization radiation through development to form a first ink flow path pattern; (7) forming, on the first and second ink flow path patterns, a coating resin layer for forming an ink flow path wall; (8) forming, in the coating resin layer placed on the pressure generating element formed on the substrate, an ink discharge port; and (9) dissolving and removing the first and second ink flow path patterns, characterized in that the second positive type photosensitive resin is the above photosensitive resin composition.

According to another aspect of the present invention, there is provided a method of producing an ink jet head including: a discharge port for discharging ink; an ink flow path which is in communication with the discharge port and has therein a pressure generating element for discharging the ink; a substrate on which the pressure generating element is formed; and an ink flow path forming member which is joined to the substrate to form the ink flow path, the method including: (1) a step of forming a layer of the above photosensitive resin composition on the substrate on which the pressure generating element is formed; (2) a first photolithographic step of removing a part except a part serving as a first ink flow path pattern of the layer of the photosensitive resin composition up to a predetermined depth in a thickness direction to form the first ink flow path pattern composed of a part protruding from the predetermined depth; (3) a second photolithographic step of removing a part on the substrate except a part serving as a second ink flow path pattern of the layer of the photosensitive resin composition on which the first ink flow path pattern is formed while maintaining the shape of the first ink flow path pattern to prepare a level difference structure in which the first ink flow path pattern is placed on the second ink flow path pattern; (4) a step of forming, on the level difference structure, a coating resin layer for forming an ink flow path wall; (5) a step of forming, in the coating resin layer placed on the pressure generating element formed on the substrate, an ink discharge port; and (6) a step of dissolving and removing the level difference structure, characterized in that: the first lithography step includes process steps of exposure, heating after exposure, and development; a reaction for making the layer of the photosensitive resin composition positive in the first photolithographic step is derived from at least a hydrolytic reaction of a carboxylic anhydride in the acrylic resin; the second photolithographic step includes process steps of exposure and development; and a reaction for making the layer of the photosensitive resin composition positive in the second photolithographic step is derived from at least a main chain decomposition reaction of the acrylic resin.

According to another aspect of the present invention, there is provided an ink jet head produced according to any one of the above methods of producing an ink jet head.

The positive type photosensitive resin composition of the present invention has high sensitivity and can reduce a processing time in a pattern formation process. Furthermore, according to the present invention, a high-accuracy ink jet head which enables high-speed-and-high-image-quality printing can be produced by means of a simple method with high efficiency and in high yield. In addition, according to the present invention, a level difference pattern useful in producing such an ink jet head can be formed with high accuracy and high efficiency.

BEST MODE FOR CARRYING OUT THE INVENTION

Figure 1:
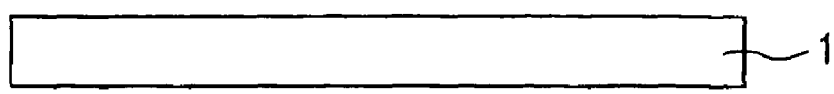
FIG. 1 is a sectional view of a substrate.

The positive type photosensitive resin composition to be used in the present invention contains at least: (1) an acrylic resin having a carboxylic anhydride structure in a molecule; and (2) a compound that generates an acid when irradiated with light. The photosensitive resin composition causes 2 kinds of reactions for making positive: a reaction for making positive derived from hydrolysis due to a so-called chemical amplification reaction and a reaction for making positive derived from a main chain decomposition reaction of an acrylic main chain. In the former reaction for making positive, the carboxylic anhydride structure in the acrylic resin structure undergoes a hydrolytic reaction under an acid condition to significantly improve solubility with respect to an alkali solution. That is, a cation produced and diffused by performing light irradiation and post exposure bake (PEB) by using a photoacid generator causes the hydrolysis of the carboxylic anhydride structure in the resin to produce a carboxylic acid, thereby improving solubility with respect to an alkali developer. As a result, the photosensitive resin composition can be used as a high-sensitivity positive type resist. In addition, in the latter reaction for making positive, a main chain having a carbon-carbon bond produced by radical polymerization of a vinyl group in the acryl monomer is cleaved by a so-called Norrish type reaction to reduce its molecular weight, so it can be easily dissolved into a solvent. For this reason, when a wavelength for acting a photoacid generator is set to a region in which the main chain decomposition reaction of an acrylic resin also occurs, the main chain decomposition reaction of the acrylic resin can be advanced in addition to the hydrolytic reaction of the carboxylic anhydride structure, so a photosensitive resin composition with additionally high sensitivity can be obtained. That is, a reduction in molecular weight derived from the main chain decomposition reaction of the acrylic resin, and a change in polarity and a reduction in molecular weight due to hydrolysis advance in tandem, so the sensitivity is extremely high.

When the photosensitive resin composition is used for producing an ink jet head, the photosensitive resin composition has, for example, an advantage in that a distance between a discharge-energy generating element (such as a heater) and an orifice (discharge port) and positional accuracy of the element with respect to the center of the orifice, one of the important factors affecting head properties, can be easily realized. That is, the thickness of a layer obtained by applying the positive type photosensitive resin composition according to the present invention can be strictly controlled with high reproducibility by means of a thin film coating technique conventionally used. Therefore, the distance between the discharge energy generating element and the orifice can be easily set. In addition, alignment between the discharge energy generating element and the orifice can be performed optically by means of a photolithographic technique. As a result, alignment can be performed with dramatically high accuracy as compared to a method that has been conventionally used for producing a liquid discharge recording head, the method involving bonding an ink flow path structure plate to a substrate.

On the other hand, in the case where a mold constituting a part serving as an ink flow path is formed into a structure having 2 layers each composed of a positive type photosensitive resin composition, the upper layer is constituted by the positive type photosensitive resin composition according to the present invention having high sensitivity and the lower layer is constituted by a positive type photosensitive resin composition having low sensitivity relative to the positive type photosensitive resin composition according to the present invention to set a light intensity or amount of exposure at the time of exposure of the upper layer to a low value in accordance with the high-sensitivity photosensitive resin composition constituting the upper layer. In this case, the lower layer having lower sensitivity than that of the upper layer is not sensitized at the time of exposure of the upper layer. That is, an exposing condition of the upper layer does not affect the lower layer. In this case, the upper layer and the lower layer may have the same photosensitive wavelength (wavelength region), the photosensitive wavelengths of the layers may partly overlap, or the photosensitive wavelengths may be completely separated from each other. In the case where positive type photosensitive resin compositions having the same photosensitive wavelength are used, the positive type photosensitive resin compositions are preferably selected in such a manner that the difference between the sensitivities of the upper layer and the lower layer is at least 5 times, or preferably 10 or more times.

The positive type photosensitive resin composition according to the present invention can also be suitably used for a method involving: forming a single layer of a positive type photosensitive resin composition on a substrate; forming a first pattern on the surface layer; and forming the entire layer into a second pattern while maintaining the first pattern. In particular, the positive type photosensitive resin composition according to the present invention can adjust the film thickness to be developed by controlling the amount of a photoacid generator to be added and a PEB condition as described later. Therefore, a precise first pattern can be formed up to a predetermined depth with high accuracy. In particular, in the case of a head having a further shortened distance between a discharge pressure generating element and a discharge port, the thickness of a mold constituting a part serving as an ink flow path is also set to be extremely small, so the formation of a first pattern requires high accuracy particularly in a depth direction. When a positive type photosensitive resin composition causing only a single reaction for making positive is used, it is difficult to form a minute first pattern with high accuracy with no effect on a residual image layer part for forming a second pattern. On the other hand, the photosensitive resin composition according to the present invention can control the height of a first pattern by adjusting the amount of a photoacid generator to be added and a PEB condition. As a result, patterning can be performed with high accuracy.

An acrylic resin to be incorporated into the positive type photosensitive resin composition according to the present invention has a carboxylic anhydride structure in a molecule. Furthermore, the acrylic resin preferably has the carboxylic anhydride structure at a side chain thereof and preferably undergoes intramolecular cross-linking through the carboxylic anhydride structure from the viewpoint of solvent resistance. To be specific, the acrylic resin preferably has at least one kind of structural units represented by the following general formulae 1 and 2.

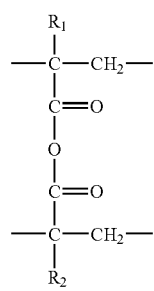

Formula 1

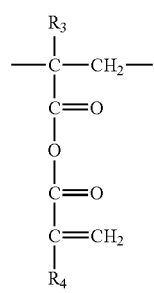

Formula 2

(In the general formulae 1 and 2, Ri to $R_4$ each independently represent a hydrogen atom or an alkyl group having 1 to 3 carbon atoms. Ri and $R_4$ each have the above meaning for each unit.) The acrylic resin can be produced by radical polymerization of a methacrylic anhydride monomer alone or of the monomer and another acrylic monomer such as methyl methacrylate, ethyl methacrylate, propyl methacrylate, or isopropyl methacrylate by means of a conventionally known method. For example, when a copolymer of methacrylic anhydride and methyl methacrylate is used, the copolymerization ratio and molecular weight of the copolymer can be arbitrarily set. However, as a ratio of methacrylic anhydride increases, a gel component is apt to be produced during radical polymerization. In contrast, as the ratio of methacrylic anhydride reduces, the sensitivity as a resist tends to reduce. In view of the above, methacrylic anhydride and methyl methacrylate are preferably copolymerized at a methacrylic anhydride/methyl methacrylate ratio of 5 mol %/95 mol % to 30 mol %/70 mol %. In addition, a low molecular weight tends to result in poor film formability, while a high molecular weight tends to reduce sensitivity. Therefore, a weight average molecular weight (Mw) is preferably about 20,000 to 60,000.

In addition, a compound that generates an acid when irradiated with light to be used in the present invention is not particularly limited. Preferable examples thereof include: aromatic sulfonium salts such as TPS-102, 103, 105, MDS-103, 105, 205, 305, DTS-102, 103 commercially available from Midori Kagaku Co., Ltd. and SP-170, 172 commercially available from ASAHI DENKA Co., Ltd.; aromatic iodonium salts such as DPI-105, MPI-103, 105, BBI-101, 102, 103, 105 commercially available from Midori Kagaku Co., Ltd.; and triazine compounds such as TAZ-101, 102, 103, 104, 105, 106, 107, 110, 111, 113, 114, 118, 119, 120 commercially available from Midori Kagaku Co., Ltd. In addition, the compound may be added in such amount as may provide target sensitivity. In particular, the compound can be suitably used in an amount in the range of 1 to 7 mass % with respect to the acrylic resin. For example, SP-100 commercially available from ASAHI DENKA Co., Ltd. may be added as a wavelength sensitizer as required.

A general-purpose solvent coat method such as spin coating or slit coating is applicable to the formation of the layer of the photosensitive resin composition. Although a bake temperature can be arbitrarily set, a heat treatment is performed preferably at 90° C. to 280° C. for 1 minute to 120 minutes, or particularly preferably at 120° C. to 250° C. for 3 minutes to 60 minutes in order to impart sufficient solvent resistance.

Next, each embodiment of a method of producing an ink jet head using the positive type photosensitive resin composition according to the present invention (including a method of forming a level difference pattern) will be described.

Embodiment 1

FIGS. 1 to 10 each schematically show the cross section of the structure of an ink jet head and a method of producing the same. First, a substrate 1 as shown in FIG. 1 is prepared. The shape, material, and the like of the substrate are not particularly limited as long as the substrate can function as part of an ink flow path constitution member, and can also function as a support for a material layer with which an ink flow path and an ink discharge port to be described later are formed. In this example, a silicon substrate is used because an ink supply port penetrating through the substrate is formed by means of anisotropic etching to be described later.

Figure 2:
FIG. 2 is a sectional view of the substrate on which an ink discharge pressure generating element is formed.

A desired number of ink discharge pressure generating elements 2 such as an electrothermal converting element and a piezoelectric element are arranged on the substrate 1 (FIG. 2). The ink discharge pressure generating elements 2 provide an ink liquid with discharge energy for discharging ink liquid droplets, whereby recording is performed. For example, when electrothermal converting elements are used as the ink discharge pressure generating elements 2, the elements heat a recording solution near them to cause a change in state of the ink, thereby generating discharge energy. For example, when piezoelectric elements are used, discharge energy is generated by the mechanical vibration of the elements.

Electrodes for inputting control signals (not shown) for operating the elements are connected to those discharge pressure generating elements 2. In general, various functional layers such as a protective layer (not shown) for improving the durability of those discharge pressure generating elements 2 and an adhesion improving layer (not shown) for improving adhesiveness between a nozzle constitution member to be described later and the substrate are arranged. In the present invention as well, those functional layers may be arranged with no problem.

Figure 3:
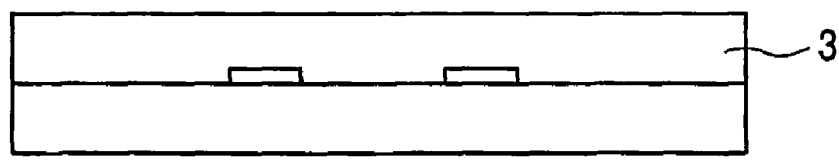
FIG. 3 is a sectional view of the substrate on which a layer of a photosensitive resin composition is formed.
Figure 4:
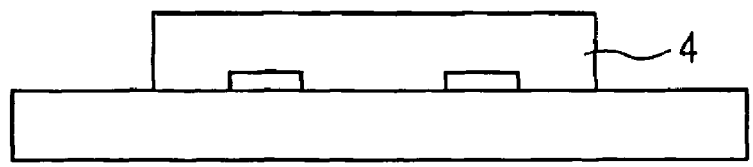
FIG. 4 is a sectional view of the substrate on which a flow path pattern is formed.

Next, as shown in FIG. 3, a layer 3 of the photosensitive resin composition according to the present invention is formed on the substrate 1 including the ink discharge pressure generating elements 2 (FIG. 3), and the photosensitive resin composition is patterned through a series of photolithographic steps to form an ink flow path pattern 4 (FIG. 4). A positive type resist is generally used because the ink flow path pattern 4 must be dissolved and removed in a subsequent step. The photosensitive resin composition according to the present invention described above is used as the positive type resist.

To be specific, an application solution is prepared by dissolving the photosensitive resin composition according to the present invention into a solvent, and is applied to a predetermined site of the substrate and dried to form the layer 3 of the photosensitive resin composition. A bake treatment is performed as required, and then the resultant is subjected to: pattern exposure by means of UV irradiation equipment (not shown) through a photomask (not shown); and a PEB treatment by means of a hot plate (not shown). Although a PEB condition may be arbitrarily set, a heat treatment at 90 to 150° C. for about 1 to 5 minutes is preferable. The light to which the layer of the photosensitive resin composition of the present invention is exposed may be ionization radiation such as a far ultraviolet ray, an X-ray, or an electron beam in addition to an ultraviolet ray.

Next, development is performed. Any developer can be used as long as the developer can dissolve an exposed portion and hardly dissolves an unexposed portion. The inventors of the present invention have made extensive studies to find that a developer containing: a glycol ether which can be mixed with water at an arbitrary ratio and has 6 or more carbon atoms; a nitrogen-containing basic organic solvent; and water is particularly suitably used. The glycol ether to be particularly suitably used is at least one kind of ethylene glycol monobutyl ether and diethylene glycol monobutyl ether, while the nitrogen-containing basic organic solvent to be particularly suitably used is one containing at least one kind of ethanolamine and morpholine. For example, a developer having the composition disclosed in JP-A 03-10089 is also suitably used as a developer for polymethyl methacrylate (PMMA) used as a resist in X-ray photolithography in the present invention. For example, a developer having a composition ratio of the respective components described above of 60 vol % of diethylene glycol monobutyl ether, 5 vol % of ethanolamine, 20 vol % of morpholine, and 15 vol % of ion-exchanged water may be used. The preferable composition range of the developer is such that the glycol ether which can be mixed with water at an arbitrary ratio and has 6 or more carbon atoms accounts for 50 to 70 vol % while the nitrogen-containing basic organic solvent accounts for 20 to 30 vol % (the balance being ion-exchanged water).

Figure 5:
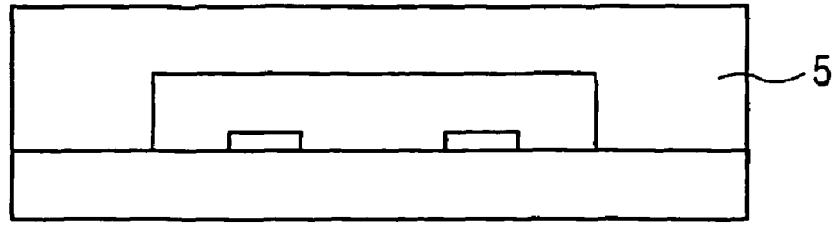
FIG. 5 is a sectional view of the substrate on which a nozzle constitution member is formed.

As shown in FIG. 5, a nozzle constitution member 5 is formed by means of a method such as spin coating, roll coating, or slit coating on the substrate 1 on which the flow path pattern 4 is formed. Here, the nozzle constitution member 5 is preferably photosensitive because an ink discharge port 7 to be described later can be easily formed with high accuracy by photolithography. Such photosensitive coating resin is requested to have high mechanical strength as a structural material, adhesiveness with a base, and ink resistance as well as resolution for patterning a minute pattern of an ink discharge port. A cationically polymerizable epoxy resin composition can be suitably used as a material satisfying those properties.

Examples of an epoxy resin to be used in the present invention include, without limitation, a product having a molecular weight of about 900 or more out of products of a reaction between bisphenol A and epichlorohydrin, a product of a reaction between bromo-containing bisphenol A and epichlorohydrin, a product of a reaction between phenol novolac or o-cresol and epichlorohydrin, and a polyfunctional epoxy resin having an oxycyclohexane skeleton described in each of JP-A 60-161973, JP-A 63-221121, JP-A 64-9216, and JP-A 02-140219.

A compound having an epoxy equivalent of preferably 2,000 or less, or more preferably 1,000 or less is suitably used as the epoxy compound. This is because an epoxy equivalent in excess of 2,000 reduces a cross-linking density at the time of a curing reaction to cause problems in terms of adhesiveness and ink resistance.

A compound that generates an acid when irradiated with light can be used as a cationic photopolymerization initiator for curing the epoxy resin. For example, SP-150, SP-170, or SP-172 commercially available from ASAHI DENKA Co., Ltd. can be suitably used. An additive or the like may be appropriately added as required to the composition. For example, a flexibility imparting agent is added for the purpose of reducing the elasticity of the epoxy resin, or a silane coupling agent is added for obtaining additional adhesion with a base.

Figure 6:
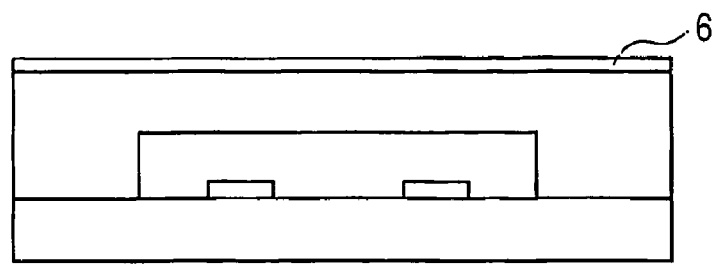
FIG. 6 is a sectional view of the substrate on which an ink repellent agent layer is formed.

Next, an ink repellent agent layer 6 having photosensitivity is formed on the nozzle constitution member 5 (FIG. 6). The ink repellent agent layer 6 can be formed by means of a coating method such as spin coating, roll coating, or slit coating. In this example, the nozzle constitution member 5 and the ink repellent agent layer 6 must not be compatible with each other to a degree more than necessary because the layer 6 is formed on the uncured nozzle formation member 5.

Figure 7:
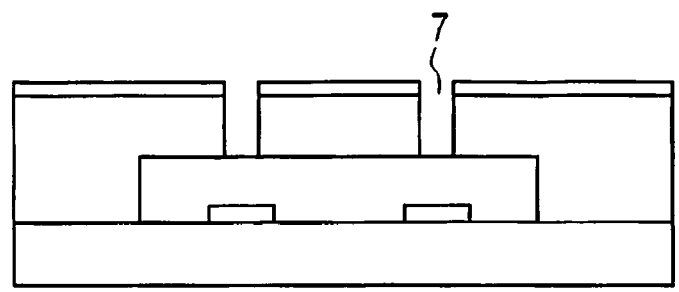
FIG. 7 is a sectional view of the substrate on which an ink discharge port is formed.

Next, the resultant is subjected to pattern exposure through a mask (not shown) and to development to form an ink discharge port 7 (FIG. 7) The nozzle constitution member 5 and the ink repellent agent layer 6 that have been subjected to the pattern exposure are developed with an appropriate solvent, whereby the ink discharge port 7 can be formed as shown in FIG. 7. At this time, the flow path pattern 4 can be dissolved and removed simultaneously with the development. However, in general, multiple heads are arranged on the substrate 1 and are used as ink jet heads after a cutting step. Therefore, the flow path pattern 4 is preferably left for coping with waste generated at the time of cutting (waste generated at the time of cutting can be prevented from entering the flow path because the flow path pattern 4 remains), and the flow path pattern 4 is preferably dissolved and removed after the cutting step.

Next, an ink supply port penetrating through the substrate 1 is formed. The ink supply port can be formed by means of anisotropic etching involving the use of a resin composition having resistance to an etchant as an etching mask. A silicon substrate having <100> and <110> crystal orientations can have selectivity in a depth direction and a width direction with respect to the advancing direction of etching when it is subjected to alkali chemical etching, whereby anisotropy of etching can be obtained. In particular, in a silicon substrate having a <100> crystal orientation, a depth to be etched is geometrically determined depending on a width to be etched, so the depth to be etched can be controlled. For example, a hole narrowing from an etching start surface in a depth direction with an inclination of 54.7° can be formed.

Figure 8:
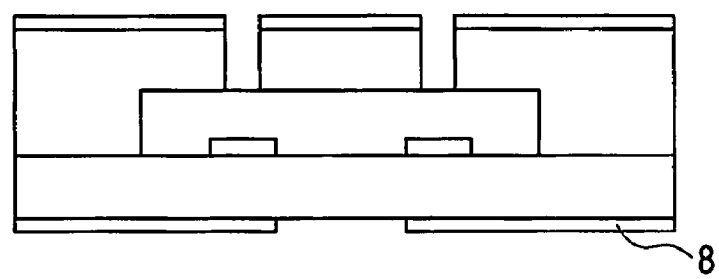
FIG. 8 is a sectional view of the substrate on which an etching mask is formed.
Figure 9:
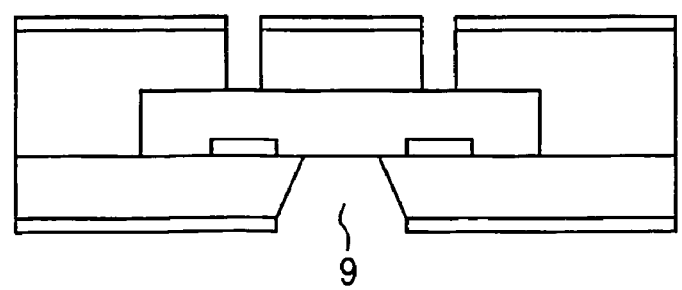
FIG. 9 is a sectional view of the substrate on which an ink supply port is formed.

As shown in FIG. 8, an etching mask 8 composed of a resin having resistance to an etchant is formed on the rear surface of the substrate 1. Then, the resultant is immersed for etching in an aqueous solution of potassium hydroxide, sodium hydroxide, tetramethylammonium hydroxide, or the like as an alkali etchant while the solution is heated, to thereby form an ink supply port 9 (FIG. 9). At this time, as described in, for example, JP-A 2001-10070, for the purpose of preventing a defect such as a pin hole, a mask having a two-layer structure with a dielectric film made of silicon oxide, silicon nitride, or the like can be used with no problem. The etching mask may be formed before the flow path pattern 4 and the nozzle constitution member 5 are formed.

Figure 10:
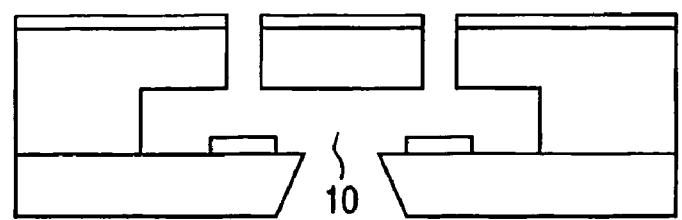
FIG. 10 is a sectional view of a complete ink jet head.

Next, after a cutting and separating step (not shown), the flow path pattern 4 is dissolved and removed, and the etching mask 8 is removed as required. Furthermore, the remainder is subjected to a heat treatment as required to completely cure the nozzle constitution member 5 and the ink repellent agent layer 6. After that, joining of a member for ink supply (not shown) and electrical joining for driving the ink discharge pressure generating elements (not shown) are performed to complete an ink jet head (FIG. 10).

A liquid discharge head of the present invention can be produced by applying the steps described above. A production method according to the present invention is performed by means of a solvent coat method such as spin coating used in a semiconductor production technique. Therefore, an ink flow path having an extremely accurate height can be stably formed. In addition, a two-dimensional shape in a direction parallel with a substrate can be formed with an accuracy of the order of submicron because a semiconductor photolithographic technique is used.

Embodiment 2

Figure 11:
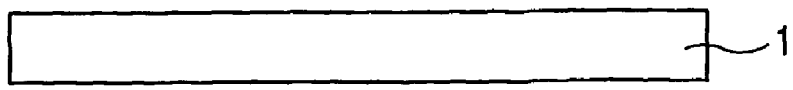
FIG. 11 is a sectional view of a substrate.

FIGS. 11 to 22 each schematically show the cross section of the structure of an ink jet head and a method of producing the same. First, a substrate 1 as shown in FIG. 11 is prepared. The shape, material, and the like of the substrate are not particularly limited as long as the substrate can function as part of an ink flow path constitution member, and can also function as a support for a material layer with which an ink flow path and an ink discharge port to be described later are formed. In this example, a silicon substrate is used because an ink supply port penetrating through the substrate is formed by means of anisotropic etching to be described later.

Figure 12:
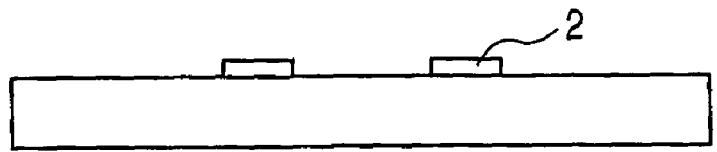
FIG. 12 is a sectional view of the substrate on which an ink discharge pressure generating element is formed.

A desired number of ink discharge pressure generating elements 2 such as an electrothermal converting element and a piezoelectric element are arranged on the substrate 1 (FIG. 12). The ink discharge pressure generating elements 2 provide ink with discharge energy for discharging the ink, whereby recording is performed. For example, when electrothermal converting elements are used as the ink discharge pressure generating elements 2, the elements heat ink near them to cause a change in state of the ink, thereby generating discharge energy. For example, when piezoelectric elements are used, discharge energy is generated by the mechanical vibration of the elements.

Electrodes for inputting control signals (not shown) for operating the elements are connected to those discharge pressure generating elements 2. In general, various functional layers such as a protective layer (not shown) for improving the durability of those discharge pressure generating elements 2 and an adhesion improving layer (not shown) for improving adhesiveness between a nozzle constitution member to be described later and the substrate are arranged. In the present invention as well, those functional layers may be arranged with no problem.

Figure 13:
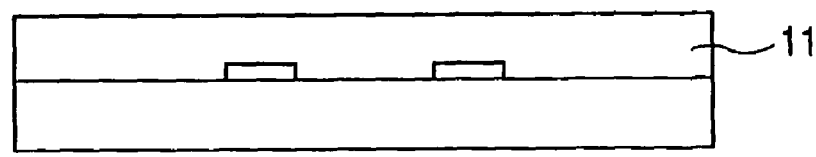
FIG. 13 is a sectional view of the substrate on which a first positive type resist layer is formed.

Next, as shown in FIG. 13, a first positive type resist layer 11 is formed on the substrate 1 including the ink discharge pressure generating elements 2. A main chain decomposition-type positive type resist generally available can be used as a first positive type resist. For example, polymethyl isopropenyl ketone (ODUR manufactured by Tokyo Ohka Kogyo Co., Ltd.), polymethyl methacrylate (PMMA), a methyl meth- acrylate-methacrylic acid copolymer, or the like can be used. The layer may be applied by means of a general-purpose solvent coat method such as spin coating or slit coating. Although a bake temperature can be arbitrarily set, a heat treatment is performed preferably at 120° C. to 280° C. for 1 minute to 120 minutes in order to impart sufficient solvent resistance.

Figure 14:
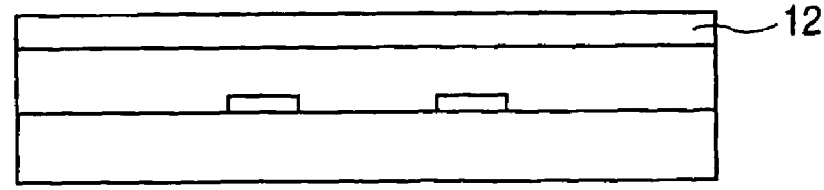
FIG. 14 is a sectional view of the substrate on which a second positive type resist layer is formed.

Next, a second positive type resist layer 12 is formed on the first positive type resist layer 11 (FIG. 14). The second positive type resist layer 12 is formed of such photosensitive resin composition containing an acrylic resin having a carboxylic anhydride structure as described above. To be specific, an application solution is prepared by dissolving the photosensitive resin composition according to the present invention into a solvent, and is applied to the first positive type resist layer 11 on the substrate and dried to form the second positive type resist layer 12. A bake treatment is performed as required. The second positive type resist layer 12 can be used as a high-sensitivity resist because, as described above, the hydrolysis of the carboxylic anhydride structure occurs to produce a carboxylic acid, thereby improving solubility with respect to an alkali developer. The high-sensitivity resist has sensitivity several ten to several hundred times as high as that of a main chain decomposition-type resist used for the first positive type resist layer 11 such as polymethyl isopropenyl ketone, polymethyl methacrylate, or a methyl methacrylate-methacrylic acid copolymer. Therefore, even in the case where an upper layer resist is exposed to light having a wavelength region in which a lower layer resist reacts, the upper layer resist can be patterned with no effect on the first positive type resist layer as the lower layer.

Furthermore, it is extremely difficult to arbitrarily set the photosensitive wavelength of a general main chain decomposition-type positive type resist as described above as a resist because the resist utilizes a Norrish type cleavage reaction, and the reaction is caused by energy absorbed by carbonyl. For this reason, when a main chain decomposition-type positive type resist is used for each of upper and lower layers, a combination of resist materials for the upper and lower layers is inevitably limited from the viewpoint of photosensitive wavelength. In contrast, the present invention provides an advantage that the selectivity of a material for a lower layer expands. In addition, even when a photosensitive wavelength must be separated, the photosensitive wavelength of an upper layer can be arbitrarily set by selecting a photoacid generator to be used for the upper resist.

Figure 15:
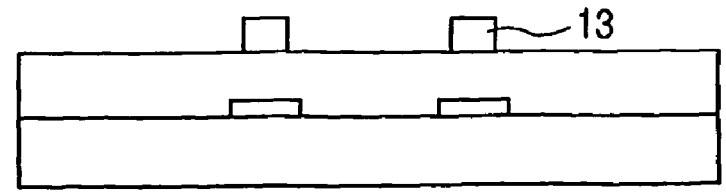
FIG. 15 is a sectional view of the substrate on which a second flow path pattern is formed.

Next, the resultant is subjected to: pattern exposure by means of UV irradiation equipment (not shown) through a photomask (not shown); PEB by means of a hot plate (not shown); and development (FIG. 15). Although a PEB condition may be arbitrarily set, a heat treatment at 90 to 150° C. for about 1 to 5 minutes is preferable.

In addition, the same developer as that in Embodiment 1 can be used.

Figure 16:
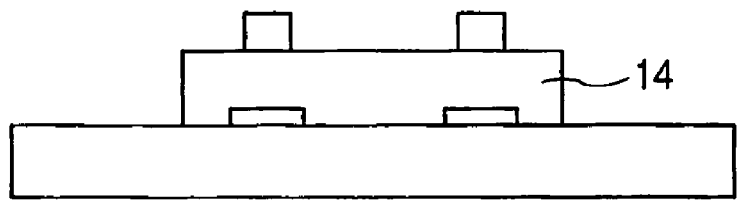
FIG. 16 is a sectional view of the substrate on which a first flow path pattern is formed.

Next, after a heat treatment to be performed as required, the first positive type resist layer 11 is subjected to pattern exposure through a photomask (not shown) and developed to form a first flow path pattern 14 (FIG. 16). Any developer can be used as the developer for the first positive type resist layer 11 as long as the developer can dissolve an exposed portion and hardly dissolves an unexposed portion. Methyl isobutyl ketone and such developer as described above are particularly preferably used.

Figure 17:
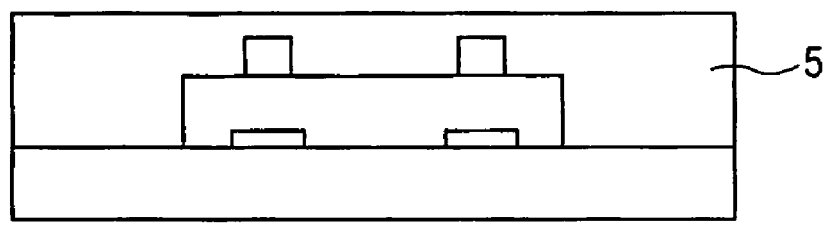
FIG. 17 is a sectional view of the substrate on which a nozzle constitution member is formed.

As shown in FIG. 17, a nozzle constitution member 5 is formed by means of a method such as spin coating, roll coating, or slit coating on the substrate 1 on which a flow path pattern having a two-layer structure composed of the second flow path pattern 13 and the first flow path pattern 14 is formed. Here, the nozzle constitution member 5 is preferably photosensitive because an ink discharge port 9 to be described later can be easily formed with high accuracy by photolithography. Such photosensitive coating resin is requested to have high mechanical strength as a structural material, adhesiveness with a base, and ink resistance as well as resolution for patterning a minute pattern of an ink discharge port. The same cationically polymerizable epoxy resin composition as that in Embodiment 1 can be suitably used as a material satisfying those properties.

Figure 18:
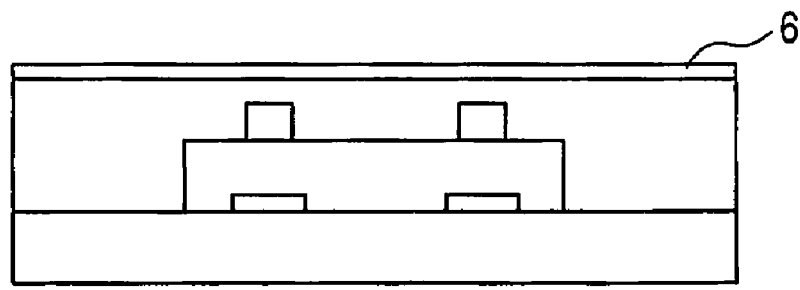
FIG. 18 is a sectional view of the substrate on which an ink repellent agent layer is formed.

Next, an ink repellent agent layer 6 having photosensitivity is formed on the nozzle constitution member 5 (FIG. 18). The ink repellent agent layer β can be formed by means of a coating method such as spin coating, roll coating, or slit coating. However, the nozzle constitution member 5 and the ink repellent agent layer 6 must not be compatible with each other to a degree more than necessary because the layer 6 is formed on the uncured nozzle formation member 5. As described above, when a cationically polymerizable chemical composition is used for the nozzle constitution member 7, it is preferable to incorporate a cationically polymerizable functional group into the ink repellent agent layer 6 having photosensitivity.

Figure 19:
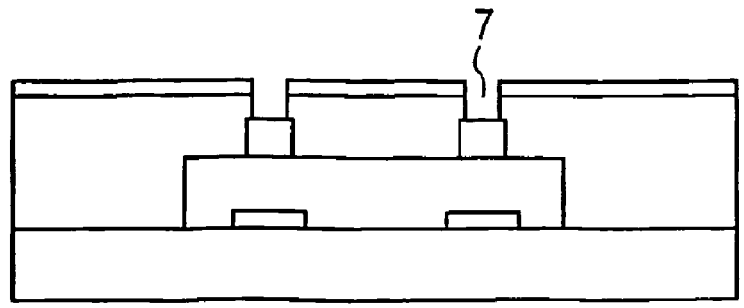
FIG. 19 is a sectional view of the substrate on which an ink discharge port is formed.

Next, the resultant is subjected to pattern exposure through a mask (not shown) and to development to form an ink discharge port 7 (FIG. 19). The nozzle constitution member 5 and the ink repellent agent layer 6 that have been subjected to the pattern exposure are developed with an appropriate solvent, whereby the ink discharge port 7 can be formed as shown in FIG. 19. At this time, the first and second flow path patterns can be dissolved and removed simultaneously with the development. However, in general, multiple heads are arranged on the substrate 1 and are used as ink jet heads after a cutting step. Therefore, the first and second flow path patterns are preferably left for coping with waste generated at the time of cutting (waste generated at the time of cutting can be prevented from entering the flow path because the flow path patterns remain), and the flow path patterns are preferably dissolved and removed after the cutting step.

Next, an ink supply port penetrating through the substrate 1 is formed. The ink supply port can be formed by means of anisotropic etching involving the use of a resin composition having resistance to an etchant as an etching mask. A silicon substrate having <100> and <110> crystal orientations can have selectivity in a depth direction and a width direction with respect to the advancing direction of etching when if is subjected to alkali chemical etching, whereby anisotropy of etching can be obtained. In particular, in a silicon substrate having a <100> crystal orientation, a depth to be etched is geometrically determined depending on a width to be etched, so the depth to be etched can be controlled. For example, a hole narrowing from an etching start surface in a depth direction with an inclination of 54.7° can be formed.

Figure 20:
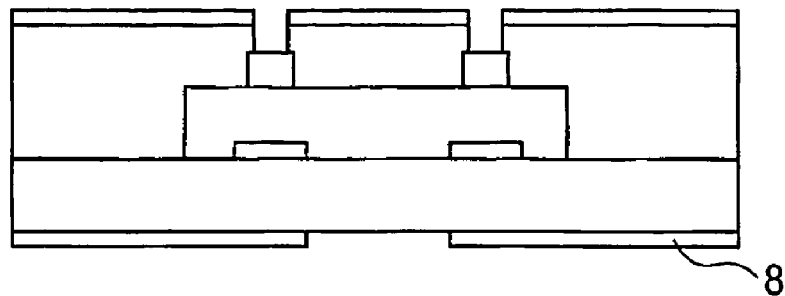
FIG. 20 is a sectional view of the substrate on which an etching mask is formed.
Figure 21:
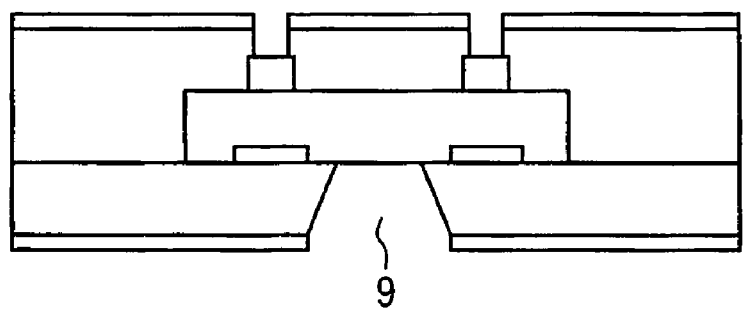
FIG. 21 is a sectional view of the substrate on which an ink supply port is formed.

As shown in FIG. 20, an etching mask 8 composed of a resin having resistance to an etchant is formed on the rear surface of the substrate 1. Then, the resultant is immersed for etching in an aqueous solution of potassium hydroxide, sodium hydroxide, tetramethylammonium hydroxide, or the like as an alkali etchant while the solution is heated, to thereby form an ink supply port 9 (FIG. 21). At this time, as described in, for example, JP-A 2001-10070, for the purpose of preventing a defect such as a pin hole, a mask having a two-layer structure with a dielectric film made of silicon oxide, silicon nitride, or the like can be used with no problem. The etching mask may be formed before the flow path patterns and the nozzle constitution member are formed.

Figure 22:
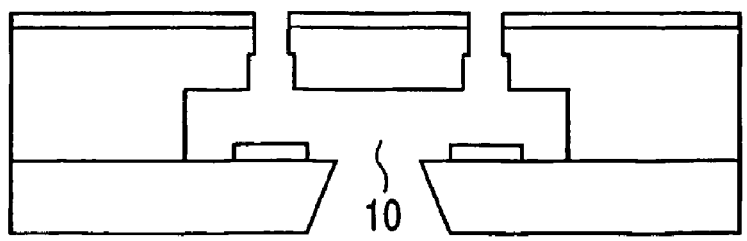
FIG. 22 is a sectional view of a complete ink jet head.

Next, after a cutting and separating step (not shown), the flow path patterns are dissolved and removed to form an ink flow path 10, and the etching mask 8 is removed as required. Furthermore, the remainder is subjected to a heat treatment as required to completely cure the nozzle constitution member 5 and the ink repellent agent layer 6. After that, joining of a member for ink supply (not shown) and electrical joining for driving the ink discharge pressure generating elements (not shown) are performed to complete an ink jet head (FIG. 22).

As described above, a production method according to the present invention is performed by means of a solvent coat method such as spin coating used in a semiconductor production technique. Therefore, an ink flow path having an extremely accurate height can be stably formed. In addition, an ink flow path can be formed into a shape with an accuracy of the order of submicron because a semiconductor photolithographic technique is used. Furthermore, the production method of the present invention provides a flow path pattern having a two-layer structure, so an ink discharge port can be formed into a convex shape. The convex shape has an increasing effect on an ink discharge speed and an increasing effect on the direct advancing property of ink. Accordingly, an ink jet head capable of performing recording with increased image quality can be provided.

Embodiment 3

FIGS. 23 to 33 each schematically show the cross section of the structure of an ink jet head and a method of producing the same. In addition, FIGS. 34 and 35 each show the sensitivity property of a positive type resist to be used in the present invention.

Figure 23:
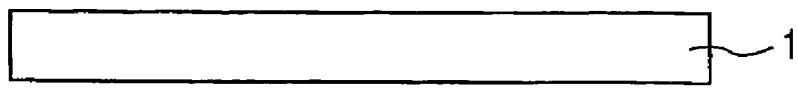
FIG. 23 is a sectional view of a substrate.

First, a substrate 1 as shown in FIG. 23 is prepared. The shape, material, and the like of the substrate are not particularly limited as long as the substrate can function as part of a liquid flow path constitution member, and can also function as a support for a material layer with which an ink flow path and an ink discharge port to be described later are formed. In this example, a silicon substrate is used because an ink supply port penetrating through the substrate is formed by means of anisotropic etching to be described later.

Figure 24:
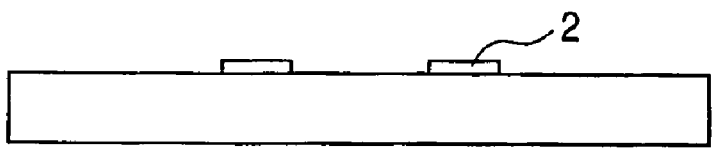
FIG. 24 is a sectional view of the substrate on which an ink discharge pressure generating element is formed.

A desired number of ink discharge pressure generating elements 2 such as an electrothermal converting element and a piezoelectric element are arranged on the substrate 1 (FIG. 24). The ink discharge pressure generating elements 2 provide ink with discharge energy for discharging the ink droplets, whereby recording is performed. For example, when electrothermal converting elements are used as the ink discharge pressure generating elements 2, the elements heat a recording solution near them to cause a change in state of the recording solution, thereby generating discharge energy. For example, when piezoelectric elements are used, discharge energy is generated by the mechanical vibration of the elements.

Electrodes for inputting control signals (not shown) for operating the elements are connected to those discharge pressure generating elements 2. In general, various functional layers such as a protective layer (not shown) for improving the durability of those discharge pressure generating elements 2 and an adhesion improving layer (not shown) for improving adhesiveness between a nozzle constitution member to be described later and the substrate are arranged. In the present invention as well, those functional layers may be arranged with no problem.

Figure 25:
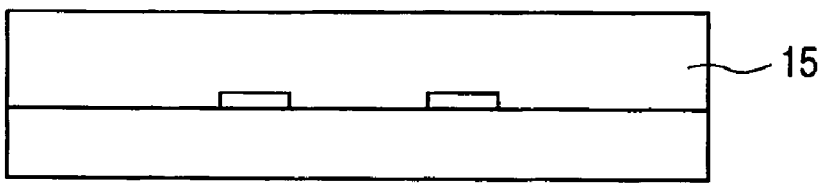
FIG. 25 is a sectional view of the substrate on which a positive type resist layer is formed.
Figure 26:
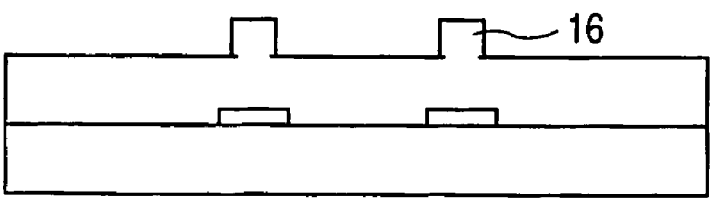
FIG. 26 is a sectional view of the substrate on which a first flow path pattern is formed.

Next, as shown in FIG. 25, a positive type resist layer 15 is formed on the substrate 1 including the ink discharge pressure generating elements 2 (FIG. 25). Part of the positive type resist layer 15 is patterned in a thickness direction in a first photolithographic step to form a first flow path pattern 16 (FIG. 26). The positive type resist layer 15 is formed of the photosensitive resin composition according to the present invention described above.

Patterning is performed in the first photolithographic step by using the reaction for making positive derived from hydrolysis, to develop a predetermined thickness of the positive type resist layer 15 formed on the substrate 1. Thus, the first flow path pattern 16 can be formed. After that, a second flow path pattern 17 is formed in a second photolithographic step to be described later by using the reaction for making positive derived from a main chain decomposition reaction. Thus, an ink flow path pattern having a convex level difference can be formed.

Furthermore, an exposure wavelength in the first photolithographic step and an exposure wavelength in the second photolithographic step may be different for the purpose of preventing the main chain decomposition reaction of the positive type resist from progressing owing to the exposure wavelength in the first photolithographic step. In this case, the main chain decomposition reaction of an acrylic copolymer occurs owing to light having a wavelength of 220 to 280 nm, so a compound reacting with light having a wavelength of an i line (365 nm) or a g line (436 nm) is preferably used as a photoacid generator, and the first photolithographic step is preferably performed by means of a stepper corresponding to each wavelength.

A general-purpose solvent coat method such as spin coating or slit coating is applicable to the formation of the positive type resist layer 15. Although a bake temperature can be arbitrarily set, a heat treatment is performed preferably at 90° C. to 280° C. for 1 minute to 120 minutes, or particularly preferably at 120° C. to 250° C. for 3 minutes to 60 minutes in order to impart sufficient solvent resistance. Subsequent to the heat treatment, the resultant is subjected to: pattern exposure by means of UV irradiation equipment (not shown) through a photomask (not shown); and a PEB treatment by means of a hot plate (not shown). Although a PEB condition may be arbitrarily set, a heat treatment at 90 to 150° C. for about 1 to 5 minutes is preferable.

Figure 34:
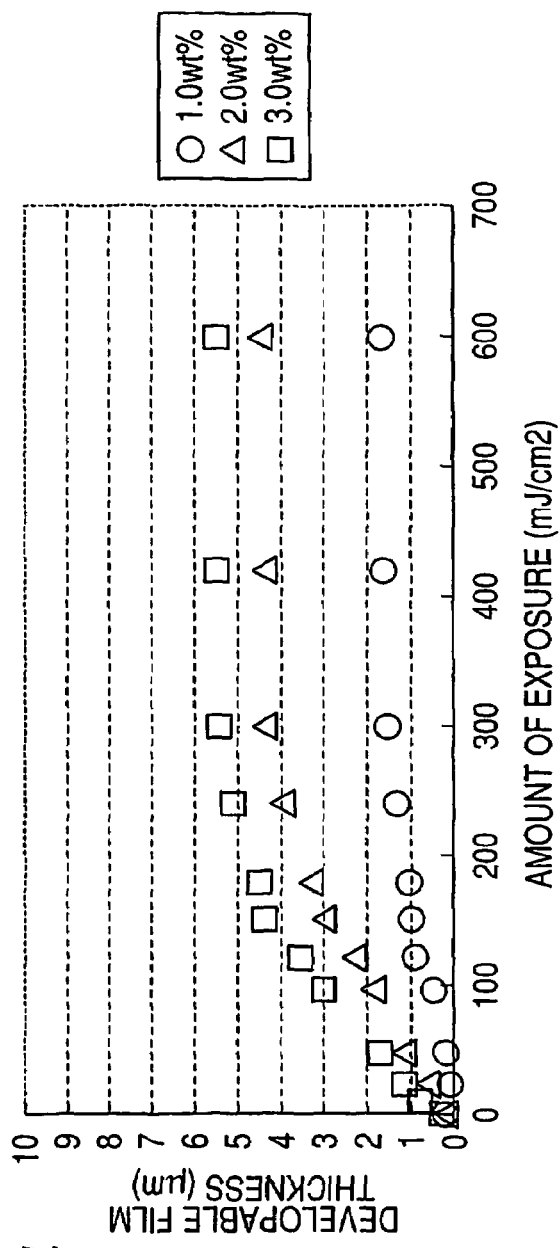
FIG. 34 is a graph showing a relationship between an amount of a photoacid generator to be added and a developable film thickness.
Figure 35:
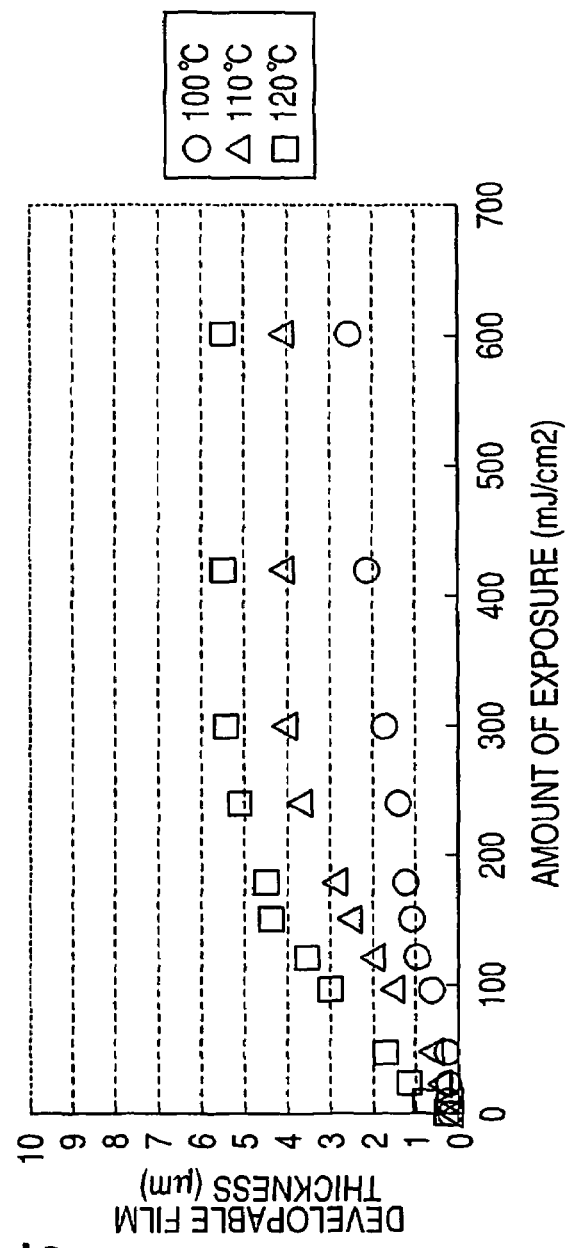
FIG. 35 is a graph showing a relationship between a PEB temperature and a developable film thickness.

For reference purposes, FIG. 34 shows a graph of a developable film thickness (PEB condition: 120° C.-180 seconds) when the addition amount of a photoacid generator (TPS-105 manufactured by Midori Kagaku Co., Ltd.) is changed, while FIG. 35 shows a graph of a developable film thickness (photoacid generator: TPS-105 manufactured by Midori Kagaku Co., Ltd., addition amount: 3 wt %, PEB time: 180 seconds) when a PEB temperature is changed. It is needless to say that the kind and addition amount of the photoacid generator, an amount of exposure, and a PEB temperature and a PEB time can be arbitrarily set in such a manner that a desired film thickness can be developed.

Figure 27:
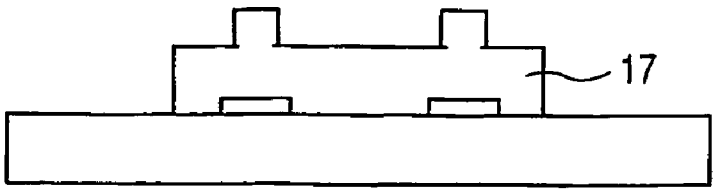
FIG. 27 is a sectional view of the substrate on which a second flow path pattern is formed.

Next, development is performed. The same developer as that in Embodiment 1 can be used. Next, a remaining part without being developed in the first photolithographic step is patterned again in the second photolithographic step to form the second flow path pattern 17 (FIG. 27). At this time, a postbake treatment may be performed before the second photolithographic step is performed. In this embodiment, the surface layer of the remaining part without being developed at the time of development in the first photolithographic step also contacts an alkali developer. For this reason, a chemical amplification reaction of the remaining part is inhibited, and patterning is performed in the second photolithographic step by using the reaction for making positive derived from a main chain decomposition reaction described above. Accordingly, a reaction with relatively low sensitivity occurs. First, simultaneously with the first photolithographic step, the resultant is subjected to: pattern exposure by means of UV irradiation equipment (not shown) through a photomask (not shown); and development. Any developer can be used as long as the developer can dissolve an exposed portion and hardly dissolves an unexposed portion. The same developer as that used in the first photolithographic step may be used. The amount of exposure may be arbitrarily set in accordance with a remaining film thickness.

Figure 28:
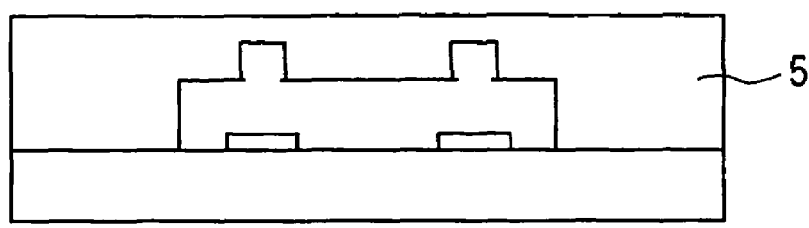
FIG. 28 is a sectional view of the substrate on which a nozzle constitution member is formed.

As shown in FIG. 28, a nozzle constitution member 5 is formed by means of a method such as spin coating, roll coating, or slit coating on the substrate 1 on which the first and second flow path patterns are formed as described above. Here, the nozzle constitution member 5 is preferably photosensitive because an ink discharge port 7 to be described later can be easily formed with high accuracy by photolithography. Such photosensitive coating resin is requested to have high mechanical strength as a structural material, adhesiveness with a base, and ink resistance as well as resolution for patterning a minute pattern of an ink discharge port. The same cationically polymerizable epoxy resin composition as that in Embodiment 1 can be suitably used as a material satisfying those properties.

Figure 29:
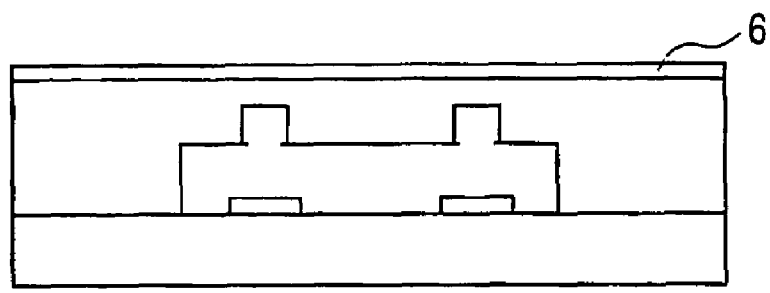
FIG. 29 is a sectional view of the substrate on which an ink repellent agent layer is formed.

Next, an ink repellent agent layer 6 having photosensitivity is formed on the nozzle constitution member 5 (FIG. 29). The ink repellent agent layer 6 can be formed by means of a coating method such as spin coating, roll coating, or slit coating. However, in this example, the nozzle constitution member 5 and the ink repellent agent layer 6 must not be compatible with each other to a degree more than necessary because the layer 6 is formed on the uncured nozzle formation member 5.

Figure 30:
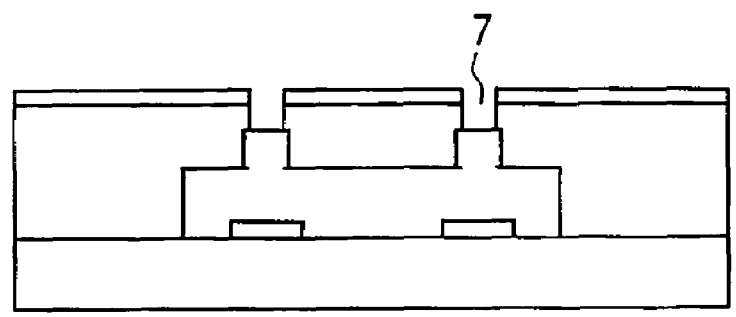
FIG. 30 is a sectional view of the substrate on which an ink discharge port is formed.

Next, the resultant is subjected to pattern exposure through a mask (not shown) and to development to form an ink discharge port 7 (FIG. 30) The nozzle constitution member 5 and the ink repellent agent layer 6 that have been subjected to the pattern exposure are developed with an appropriate solvent, whereby the ink discharge port 7 can be formed as shown in FIG. 30. At this time, the flow path patterns can be dissolved and removed simultaneously with the development. However, in general, multiple heads are arranged on the substrate 1 and are used as ink jet heads after a cutting step. Therefore, the flow path patterns are preferably left for coping with waste generated at the time of cutting (waste generated at the time of cutting can be prevented from entering the flow path because the flow path patterns remain), and the flow path patterns are preferably dissolved and removed after the cutting step.

Next, an ink supply port penetrating through the substrate 1 is formed. The ink supply port can be formed by means of anisotropic etching involving the use of a resin composition having resistance to an etchant as an etching mask. A silicon substrate having <100> and <110> crystal orientations can have selectivity in a depth direction and a width direction with respect to the advancing direction of etching when it is subjected to alkali chemical etching, whereby anisotropy of etching can be obtained. In particular, in a silicon substrate having a <100> crystal orientation, a depth to be etched is geometrically determined depending on a width to be etched, so the depth to be etched can be controlled. For example, a hole narrowing from an etching start surface in a depth direction with an inclination of 54.7° can be formed.

Figure 31:
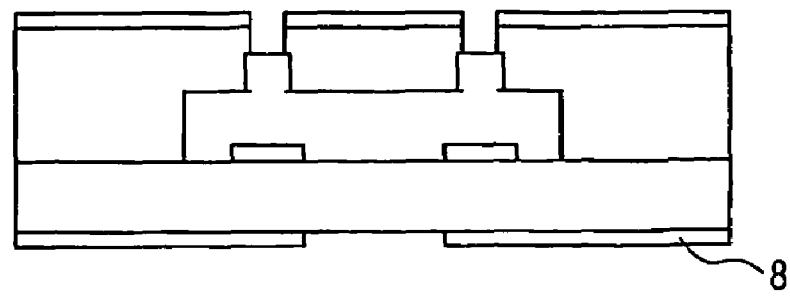
FIG. 31 is a sectional view of the substrate on which an etching mask is formed.
Figure 32:
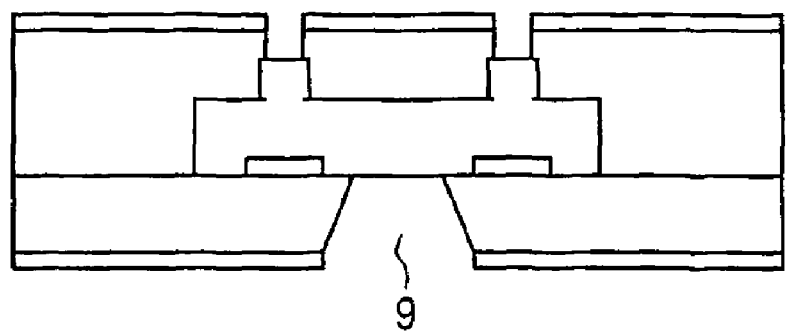
FIG. 32 is a sectional view of the substrate on which an ink supply port is formed.

As shown in FIG. 31, an etching mask 8 composed of a resin having resistance to an etchant is formed on the rear surface of the substrate 1. Then, the resultant is immersed for etching in an aqueous solution of potassium hydroxide, sodium hydroxide, tetramethylammonium hydroxide, or the like as an alkali etchant while the solution is heated, to thereby form an ink supply port 9 (FIG. 32). At this time, as described in, for example, JP-A 2001-10070, for the purpose of preventing a defect such as a pin hole, a mask having a two-layer structure with a dielectric film made of silicon oxide, silicon nitride, or the like can be used with no problem. The etching mask may be formed before the flow path patterns and the nozzle constitution member are formed.

Figure 33:
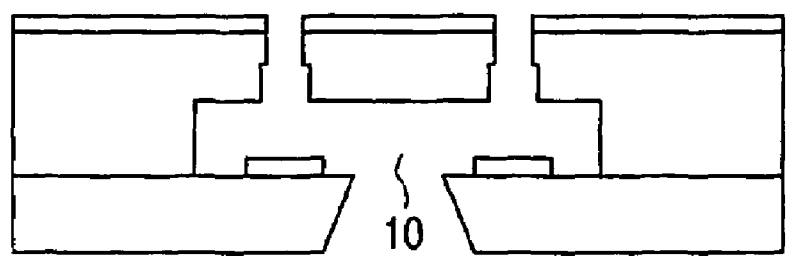
FIG. 33 is a sectional view of a complete ink jet head.

Next, after a cutting and separating step (not shown), the flow path patterns are dissolved and removed, and the etching mask 8 is removed as required. Furthermore, the remainder is subjected to a heat treatment as required to completely cure the nozzle constitution member 5 and the ink repellent agent layer 6. After that, joining of a member for ink supply (not shown) and electrical joining for driving the ink discharge pressure generating elements (not shown) are performed to complete an ink jet head (FIG. 33).

The liquid discharge head of the present invention can be produced by applying the steps described above. According to the production method according to the present invention, an ink flow path having a convex level difference can be stably formed with extremely high accuracy. In addition, a two-dimensional shape in a direction parallel with a substrate can be formed with an accuracy of the order of submicron because a semiconductor photolithographic technique is used.

In each of the figures to which reference is made to in the respective examples, an ink jet head having 2 orifices (discharge ports) is shown. It is needless to say that the same holds true for a high-density multiafray ink jet head having 3 or more orifices.

Hereinafter, specific examples will be described.

Example 1

(1) Synthesis of a Methacrylic Anhydride/Methyl Methacrylate-Copolymer 400 g of cyclohexanone were charged into a flask equipped with a stirring device and a reflux pipe, and the temperature was held at 103 to 105° C. in an oil bath. A mixture of 5.41 g (0.053 mol) of methacrylic anhydride, 48.6 g (0.468 mol) of methyl methacrylate, 2.40 g (0.015 mol) of AIBN, and 100 g of cyclohexanone was dropped into the flask over 2 hours, followed by a polymerization reaction for 3 hours. After that, the reaction solution was charged into hexane to precipitate and collect the powder of a methacrylic anhydride/methyl methacrylate copolymer. The resultant copolymer had a weight average molecular weight (Mw: in terms of polystyrene) of 30,000 and a degree of dispersion (Mw/Mn) of 3.3.

(2) Preparation of a Positive Type Resist 30 g of the resultant copolymer were dissolved into 70 g of cyclohexanone, and 1.5 g of triphenylsulfonium antimonate (TPS-103 manufactured by Midori Kagaku Co., Ltd.) were added to and dissolved into the solution. After that, the solution was filtered through a 0.2-μm membrane filter to prepare a positive type resist solution.

(3) Production of an Ink Jet Head

First, a substrate 1 as shown in FIG. 1 was prepared. A silicon substrate is most generally applicable to the substrate 1. In general, a driver, a logic circuit, or the like for controlling a discharge energy generating element is produced according to a general-purpose semiconductor production method, so silicon is preferably applied to the substrate. In this example, a silicon substrate having an electrothermal converting element (a heater composed of $HfB_2$) as an ink discharge pressure generating element 2 and a laminate film of SiN+Ta (not shown) in an ink flow path and a nozzle formation site was prepared (FIG. 2).

Next, a positive type resist layer was formed on the substrate including the ink discharge pressure generating element 2, and the whole was patterned to form an ink flow path pattern. First, the positive type resist prepared in (2) was applied by means of spin coating, and the whole was prebaked at 100° C. for 3 minutes. After that, in a nitrogen atmosphere, the resultant was subjected to a heat treatment in an oven at 150° C. for 30 minutes. A layer 3 of a photosensitive resin composition according to the present invention after the heat treatment had a thickness of 8' μm (FIG. 3).

Subsequently, by means of a Deep-UV exposing device UX-3000 manufactured by USHIO INC., the resultant was exposed to light having a wavelength of 220 to 280 nm at an amount of exposure of 200 mJ/cm$^2$. Then, the resultant was subjected to PEB at 120° C. for 180 seconds by means of a hot plate. After that, the resultant was developed with a developer composed of the following composition to form a flow path pattern 4 (FIG. 4).

| | |
|---|---|
| Diethylene glycol monobutyl ether: | 60 vol % |
| Ethanolamine: | 5 vol % |
| Morpholine: | 20 vol % |
| Ion-exchanged water: | 15 vol % |

Next, a negative type photosensitive resin composition composed of the following composition was applied by means of spin coating to the substrate to be treated (a thickness of 15 μm on a plate), and the whole was prebaked at 100° C. for 2 minutes (hot plate) to form a nozzle constitution member 5 (FIG. 5).

| | |
|---|---|
| EHPE (manufactured by Daicel Chemical Industries, Ltd.): | 100 parts by weight |
| 1,4HFAB (manufactured by Central Glass Co., Ltd.): | 20 parts by weight |
| SP-170 (manufactured by ASAHI DENKA Co., Ltd.): | 2 parts by weight |
| A-187 (manufactured by Nihon Unicar): | 5 parts by weight |
| Methyl isobutyl ketone: | 100 parts by weight |
| Diglyme: | 100 parts by weight |

Next, a photosensitive resin composition composed of the following composition was applied by means of spin coating to the substrate to be treated so as to have a thickness of 1 μm, and the whole was prebaked at 80° C. for 3 minutes (hot plate) to form an ink repellent agent layer 6 (FIG. 6).

| | |
|---|---|
| EHPE-3158 (manufactured by Daicel Chemical Industries, Ltd.): | 35 parts by weight |
| 2,2-bis (4-glycidyloxyphenyl)hexaphloropropane: | 25 parts by weight |
| 1,4-bis (2-hydroxyhexaphloroisopropyl) benzene: | 25 parts by weight |
| 3-(2-perfluorohexyl) ethoxy-1,2-epoxypropane: | 16 parts by weight |
| A-187 (manufactured by Nihon Unicar): | 4 parts by weight |
| SP-170 (manufactured by ASAHI DENKA Co., Ltd.): | 2 parts by weight |
| Diethylene glycol monoethyl ether: | 100 parts by weight |

Subsequently, by means of an MPA-600 (manufactured by CANON INC.), the resultant was exposed to light having a wavelength of 290 to 400 nm at an amount of exposure of 400 mJ/cm². Then, the resultant was subjected to PEB at 120° C. for 120 seconds by means of a hot plate. After that, the resultant was developed with methyl isobutyl ketone to pattern the nozzle constitution member 5 and the ink repellent agent layer 6, thereby forming an ink discharge port 7 (FIG. 7). In this example, a discharge port pattern of 8 μmΦ was formed.

Next, an etching mask 8 with an opening shape having a width of 1 mm and a length of 10 mm was created by means of a polyetheramide resin composition (HIMAL manufactured by Hitachi Chemical Co., Ltd.) on the rear surface of the substrate to be treated (FIG. 8). Next, the substrate to be treated was immersed in a 22-mass % aqueous solution of TMAH held at 80° C. to perform anisotropic etching of the substrate, thereby forming an ink supply port 9 (FIG. 9). At this time, the anisotropic etching was performed after a protective layer (OBC manufactured by Tokyo Ohka Kogyo Co., Ltd.: not shown) had been applied to the ink repellent agent layer 6 for the purpose of protecting the ink repellent agent layer 6 from an etchant.

Next, the OBC used as the protective layer was dissolved and removed by means of xylene, and then the entire surface of the remainder was exposed to light having a wavelength of 200 to 280 nm at an amount of exposure of 8,000 mJ/cm² through the nozzle constitution member and the ink repellent agent layer to solubilize the flow path pattern 4. Subsequently, the resultant was immersed in methyl lactate while an ultrasonic wave was applied to methyl lactate to dissolve and remove the flow path pattern 4, thereby forming an ink flow path 10. Thus, an ink jet head was produced (FIG. 10). The layer of the polyetheramide resin composition used as the etching mask was removed by dry etching using oxygen plasma.

The ink jet head thus produced was mounted on a printer, and was evaluated for discharge and recording. As a result, the ink jet head was capable of performing good image recording.

Example 2

An ink jet head was produced in the same manner as in Example 1 except that a photosensitive resin composition composed of the following composition was used as a positive type resist. The ink jet head was evaluated for discharge and recording. As a result, the ink jet head was capable of performing good image recording. The amount of exposure necessary for patterning the positive type resist was 150 mJ/cm².

| | |
|---|---|
| Radical copolymer of methacrylic anhydride and methyl methacrylate: [(monomer composition ratio 20/80: molar ratio), weight average molecular weight (Mw: in terms of polystyrene) = 28,000, degree of dispersion (Mw/Mn) = 3.5] | 30 g |
| Diphenyliodonium antimonate: (MPI-103 manufactured by Midori Kagaku Co., Ltd.) | 0.8 g |
| Cyclohexanone: | 70 g |

Example 3

An ink jet head was produced in the same manner as in Example 1 except that: a photosensitive resin composition composed of the following composition was used as a positive type resist; and exposure was performed by means of an MPA-600 (manufactured by CANON INC.) at an amount of exposure of 100 mJ/c$\tau_{n2}$ at the time of patterning. The ink jet head was evaluated for discharge and recording. As a result, the ink jet head was capable of performing good image recording.

| | |
|---|---|
| Radical copolymer of methacrylic anhydride and methyl methacrylate: [(monomer composition ratio 10/90: molar ratio), weight average molecular weight (Mw: in terms of polystyrene) = 30,000, degree of dispersion (Mw/Mn) = 3.1] | 30 g |
| SP-172 (manufactured by ASAHI DENKA Co., Ltd.): | 2.0 g |
| SP-100 (manufactured by ASAHI DENKA Co., Ltd.): | 1.0 g |
| Cyclphexanone: | 70 g |

Comparative Example 1

A flow path pattern 4 was formed in the same manner as in Example 1 except that a positive type resist to which triphenylsulfonium antimonate (TPS-103 manufactured by Midori Kagaku Co., Ltd.) was not added was used. In this case, an amount of exposure of 40,000 mJ/cm2 was necessary for patterning (PEB was not performed in this case).

Example 4

(1) Preparation of a Positive Type Resist 30 g of the copolymer prepared in Example 1 were dissolved into 70 g of cyclohexanone, and 0.9 g of triphenylsulfonium antimonate (TPS-103 manufactured by Midori Kagaku Co., Ltd.) was added to and dissolved into the solution. After that, the solution was filtered through a 0.2-μm membrane filter to prepare a positive type resist solution.

(2) Production of an Ink Jet Head

First, a substrate 1 as shown in FIG. 11 was prepared. A silicon substrate is most generally applicable to the substrate 1. In general, a driver, a logic circuit, or the like for controlling a discharge energy generating element is produced according to a general-purpose semiconductor production method, so silicon is preferably applied to the substrate. In this example, a silicon substrate having an electrothermal converting element (a heater composed of HfB$_2$) as an ink discharge pressure generating element 2 and a laminate film of SiN+Ta (not shown) in an ink flow path and a nozzle formation site was prepared (FIG. 12).

Next, as shown in FIG. 13, polymethyl isopropenyl ketone (ODUR manufactured by Tokyo Ohka Kogyo Co., Ltd.) was applied as a first positive type resist layer 11 by means of spin coating to the substrate including the ink discharge pressure generating element 2 (FIG. 12), and the whole was baked at 150° C. for 3 minutes. The resist layer after the baking had a thickness of 10 μm.

Next, the positive type resist prepared in (2) was applied as a second positive type resist layer 12 by means of spin coating, and the whole was baked at 150° C. for 6 minutes. The resist layer after the baking had a thickness of 5 μm (FIG. 14).

Subsequently, the second positive type resist layer was patterned. By using a Deep-UV exposing device UX-3000 manufactured by USHIO INC. as an exposing device, the resultant was subjected to pattern exposure at an amount of exposure of 200 mJ/cm². Then, the resultant was subjected to PEB at 120° C. for 180 seconds by means of a hot plate. After that, the resultant was developed with a developer composed of the same composition as that of Example 1 to form a second flow path pattern 13 (FIG. 15).

Subsequently, the first positive type resist layer was patterned. By using an identical exposing device, the resultant was subjected to pattern exposure at an amount of exposure of 23,000 mJ/cm$^2$, developed with methyl isobutyl ketone, and subjected to a rinse treatment with isopropyl alcohol to form a first flow path pattern 14 (FIG. 16).

Next, a negative type photosensitive resin composition composed of the same composition as that of Example 1 was applied by means of spin coating to the substrate to be treated (a thickness of 20 µm on a plate), and the whole was baked at 100° C. for 2 minutes (hot plate) to form a nozzle constitution member 5 (FIG. 17).

Next, a photosensitive resin composition composed of the same composition as that of Example 1 was applied by means of spin coating to the substrate to be treated so as to have a thickness of 1 µm, and the whole was baked at 80° C. for 3 minutes (hot plate) to form an ink repellent agent layer 6 (FIG. 18).

Subsequently, by means of an MPA-600 (manufactured by CANON INC.), the resultant was subjected to pattern exposure at an amount of exposure of 400 mJ/cm$^2$. Then, the resultant was subjected to PEB at 120° C. for 120 seconds by means of a hot plate. After that, the resultant was developed with methyl isobutyl ketone to pattern the nozzle constitution member 5 and the ink repellent agent layer 6, thereby forming an ink discharge port 7 (FIG. 19). In this example, a discharge port pattern of 10 µmΦ was formed.

Next, an etching mask 8 with an opening shape having a width of 1 mm and a length of 10 mm was created by means of a polyetheramide resin composition (HIMAL manufactured by Hitachi Chemical Co., Ltd.) on the rear surface of the substrate to be treated (FIG. 20). Next, the substrate to be treated was immersed in a 22-wt % aqueous solution of TMAH held at 80° C. to perform anisotropic etching of the substrate, thereby forming an ink supply port 9 (FIG. 21). At this time, the anisotropic etching was performed after a protective layer (OBC manufactured by Tokyo Ohka Kogyo Co., Ltd.: not shown) had been applied to the ink repellent agent layer 8 for the purpose of protecting the ink repellent agent layer 6 from an etchant.

Next, the OBC used as the protective layer was dissolved and removed by means of xylene, and then the entire surface of the remainder was exposed to light at an amount of exposure of 250,000 mJ/cm$^2$ through the nozzle constitution member and the ink repellent agent layer by means of a Deep-UV exposing device UX-3000 manufactured by USHIO INC. to solubilize the flow path patterns 13 and 14. Subsequently, the resultant was immersed in methyl lactate while an ultrasonic wave was applied to methyl lactate to dissolve and remove the flow path patterns 13 and 14, thereby producing an ink jet head (FIG. 22). The layer of the polyetheramide resin composition used as the etching mask was removed by dry etching using oxygen plasma.

The ink jet head thus produced was mounted on a printer, and was evaluated for discharge and recording. As a result, the ink jet head was capable of performing good image recording.

Example 5

An ink jet head was produced in the same manner as in Example 4 except that a positive type resist composed of the same composition as that of Example 2 was used as a second positive type resist. The ink jet head was evaluated for discharge and recording. As a result, the ink jet head was capable of performing good image recording. The amount of exposure necessary for patterning the positive type resist was 150 mJ/cm$^2$.

Example 6

An ink jet head was produced in the same manner as in Example 1 except that: a photo-degradable positive type resist composed of the following composition was used as a first positive type resist; and an amount of exposure at the time of patterning was set to 40,000 mJ/cm$^2$. The ink jet head was evaluated for discharge and recording. As a result, the ink jet head was capable of performing good image recording.

Radical copolymer of methyl methacrylate and methacrylic acid

[(monomer composition ratio 90/10: molar ratio), weight average molecular weight (Mw: in terms of polystyrene) =120,000, degree of dispersion (Mw/Mn)=1.8]

Comparative Example 2

A flow path pattern having a two-layer structure was formed in the same manner as in Example 4 except that a second positive type resist to which triphenylsulfonium antimonate (TPS-103 manufactured by Midori Kagaku Co., Ltd.) was not added was used. In this case, an amount of exposure of 20,000 mJ/cm$^2$ was necessary for patterning the second positive type resist. As a result, a trouble occurred, in which part of the first positive type resist layer was developer at the time of development of the second positive type resist layer.

Example 7

(1) Preparation of a Positive Type Resist 30 g of the resultant copolymer were dissolved into 70 g of cyclohexanone, and 0.6 g of triphenylsulfonium triphlate (TPS-105 manufactured by Midori Kagaku Co., Ltd.) was added to and dissolved into the solution. After that, the solution was filtered through a 0.2-µm membrane filter to prepare a positive type resist solution.

(2) Production of an Ink Jet Head

First, a substrate 1 as shown in FIG. 23 was prepared. A silicon substrate is most generally applicable to the substrate 1. In general, a driver, a logic circuit, or the like for controlling a discharge energy generating element is produced according to a general-purpose semiconductor production method, so silicon is preferably applied to the substrate. In this example, a silicon substrate having an electrothermal converting element (a heater composed of HfBo) as an ink discharge pressure generating element 2 and a laminate film of SiN+Ta (not shown) in an ink flow path and a nozzle formation site was prepared (FIG. 24).

Next, as shown in FIG. 25, a positive type resist layer was formed on the substrate including the ink discharge pressure generating element 2. The above positive type resist was applied by means of spin coating, and the whole was prebaked at 100° C. for 3 minutes. After that, in a nitrogen atmosphere, the resultant was subjected to a heat treatment in an oven at 150° C. for 30 minutes. The resist layer after the heat treatment had a thickness of 10 µM (FIG. 25).

Subsequently, the resultant was exposed to Deep-UV light having a wavelength of 200 to 280 nm at an amount of exposure of 400 mJ/cm$^2$. Then, the resultant was subjected to PEB at 120° C. for 180 seconds by means of a hot plate. After that, the resultant was developed with the same developer as that of Example 1 to form a first flow path pattern 16 (FIG. 26). At this time, the first flow path pattern had a height of 4 μm.

Subsequently, the resultant was exposed to Deep-UV light having a wavelength of 200 to 280 nm at an amount of exposure of 40,000 mJ/cm². Then, the resultant was developed with the same developer as that described above to form a second flow path pattern 17 (FIG. 27). Thus, an ink flow path pattern was obtained, which had the first flow path pattern 16 having a height of 4 μm on the second flow path pattern 17 having a height of 6 μm.

Next, a photosensitive resin composition composed of the same composition as that of Example 1 was applied by means of spin coating to the substrate to be treated (a thickness of 15 μm on a plate), and the whole was baked at 100° C. for 2 minutes (hot plate) to form a nozzle constitution member 5 (FIG. 28).

Subsequently, a photosensitive resin composition composed of the same composition as that of Example 1 was applied by means of spin coating to the substrate to be treated so as to have a thickness of 1 μm, and the whole was baked at 80° C. for 3 minutes (hot plate) to form an ink repellent agent layer 6 (FIG. 29).

Next, by means of an MPA-600 (manufactured by CANON INC.), the resultant was subjected to pattern exposure with light having a wavelength of 290 to 400 nm at an amount of exposure of 400 mJ/cm². Then, the resultant was subjected to PEB at 90° C. for 120 seconds by means of a hot plate. After that, the resultant was developed with methyl isobutyl ketone to pattern the nozzle constitution member 5 and the ink repellent agent layer β, thereby forming an ink discharge port 7 (FIG. 30). In this example, a discharge port pattern of 8 μmΦ was formed.

Next, an etching mask 8 with an opening shape having a width of 1 mm and a length of 10 mm was created by means of a polyetheramide resin composition (HIMAL manufactured by Hitachi Chemical Co., Ltd.) on the rear surface of the substrate to be treated (FIG. 9). Next, the substrate to be treated was immersed in a 22-wt % aqueous solution of TMAH held at 80° C. to perform anisotropic etching of the substrate, thereby forming an ink supply port 9 (FIG. 31). At this time, the anisotropic etching was performed after a protective layer (OBC manufactured by Tokyo Ohka Kogyo Co., Ltd.: not shown) had been applied to the ink repellent agent layer 6 for the purpose of protecting the ink repellent agent layer 6 from an etchant.

Next, the OBC used as the protective layer was dissolved and removed by means of xylene, and then the entire surface of the remainder was exposed to light having a wavelength of 200 to 280 nm at an amount of exposure of 80,000 mJ/cm² through the nozzle constitution member and the ink repellent agent layer to solubilize the ink flow path pattern. Subsequently, the resultant was immersed in methyl lactate while an ultrasonic wave was applied to methyl lactate to dissolve and remove the ink flow path pattern, thereby producing an ink jet head (FIG. 33). The layer of the polyetheramide resin composition used as the etching mask was removed by dry etching using oxygen plasma.

The ink jet head thus produced was mounted on a printer, and was evaluated for discharge and recording. As a result, the ink jet head was capable of performing good image recording.

Example 8

An ink jet head was produced in the same manner as in Example 7 except that: a photosensitive resin composition composed of the following composition was used as a positive type resist; a reaction for making positive derived from hydrolysis was allowed to correspond to an i line; and exposure was performed by means of an i line stepper (manufactured by CANON INC.: FPA-3000iW) at an amount of exposure of 1,000 J/m² at the time of patterning in the first photolithographic step. The ink jet head was evaluated for discharge and recording. As a result, the ink jet head was capable of performing good image recording. The first flow path pattern 16 formed at this time had a height of 5 μm.

| | |
|---|---|
| Radical copolymer of methacrylic anhydride and methyl methacrylate: (same as that of Example 7) | 30 g |
| SP-172 (manufactured by ASAHI DENKA Co., Ltd.): | 2.0 g |
| SP-100 (manufactured by ASAHI DENKA Co., Ltd.): | 1.0 g |
| Cyclohexanone: | 70 g |

Example 9

An ink jet head was produced in the same manner as in Example 7 except that: a photosensitive resin composition composed of the following composition was used as a positive type resist; and PEB was performed at 110° C. for 180 seconds at the time of patterning in the first photolithographic step. The ink jet head was evaluated for discharge and recording. As a result, the ink jet head was capable of performing good image recording. The first flow path pattern 16 formed at this time had a height of 4 μm.

| | |
|---|---|
| Radical copolymer of methacrylic anhydride and methyl methacrylate: (same as that of Example 7) | 30 g |
| TPS-105 (manufactured by Midori Kagaku Co., Ltd.): | 0.9 g |
| Cyclohexanone: | 70 g |

This application claims priority from Japanese Patent Application No. 2004-190479 filed on Jun. 28, 2004, which is hereby incorporated by reference herein.

The invention claimed is:

1. A method of producing an ink jet head including: a discharge port for discharging ink; an ink flow path which is in communication with the discharge port and has therein an energy generating element for discharging the ink; a substrate on which the energy generating element is formed; and an ink flow path forming member which is provided the substrate to form the ink flow path, the method comprising:
   (1) a step of forming a first layer of the photosensitive resin composition comprising an acrylic resin having at least one kind of structural unit represented by formulas 1 and 2

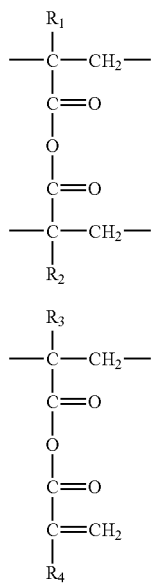

Formula 1

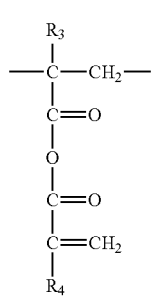

Formula 2 wherein in the general formulae 1 and 2, $R_1$ to $R_4$ each independently represent a hydrogen atom or an alkyl group having 1 to 3 carbon atoms and a compound that generates an acid when irradiated with light on the substrate;

(2) a first exposing step of exposing a part except a part serving as a first ink flow path pattern of the first layer up to a first depth in a thickness direction, wherein a reaction for making the exposed part of the first layer positive is at least a hydrolytic reaction of a carboxylic anhydride in the acrylic resin;

(3) a first removing step of removing the exposed part of the first layer;

(4) a second exposing step of exposing an outside of a part of the first ink flow path pattern in the first layer from a position of the first depth to the substrate, wherein a reaction for making exposed part of the first layer positive in the second exposing step is at least a main chain decomposition reaction of the acrylic resin;

(5) a second removing step of removing exposed part of the first layer in the second exposing step to form the second ink flow path pattern in the first layer to form the first ink flow path pattern;

(6) a step of providing on the first layer with the first and second ink flow path pattern, a second layer for forming an ink flow path wall;

(7) a step of forming, in the second layer, an ink discharge port; and (8) a step of removing the first layer with the first and second ink flow path pattern to form the flow path.

2. A method of producing an ink jet head according to claim 1, wherein an exposure wavelength in the first exposing step is longer than an exposure wavelength in the second exposing step.

3. A method of producing an ink jet head according to claim 1, wherein a developer containing: (1) a glycol ether which can be mixed with water at an arbitrary ratio and has 6 or more carbon atoms; (2) a nitrogen-containing basic organic solvent; and (3) water is used as a developer for the photosensitive resin.

4. A method of producing an ink jet head according to claim 3, wherein the glycol ether comprises at least one kind of ethylene glycol monobutyl ether and diethylene glycol monobutyl ether.

5. A method of producing an ink jet head according to claim 3, wherein the nitrogen-containing basic organic solvent comprises at least one kind of ethanolamine and morpholine.

* * * * *